(12) United States Patent
Momtaz et al.

(10) Patent No.: US 8,618,964 B2
(45) Date of Patent: Dec. 31, 2013

(54) DISTRIBUTED THRESHOLD ADJUSTMENT FOR HIGH SPEED RECEIVERS

(75) Inventors: Afshin Momtaz, Laguna Hills, CA (US); Namik Kocaman, San Clemente, CA (US); Bharath Raghavan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 346 days.

(21) Appl. No.: 13/207,887

(22) Filed: Aug. 11, 2011

(65) Prior Publication Data

US 2011/0291757 A1 Dec. 1, 2011

Related U.S. Application Data

(63) Continuation of application No. 12/582,442, filed on Oct. 20, 2009, now Pat. No. 8,077,060.

(60) Provisional application No. 61/172,330, filed on Apr. 24, 2009.

(51) Int. Cl.
*H03M 1/06* (2006.01)
(52) U.S. Cl.
USPC ............... 341/118; 341/50; 341/51; 341/52; 341/155; 341/166
(58) Field of Classification Search
USPC ............ 341/50, 51, 52, 155, 166, 118; 365/185.09; 375/271, 316
See application file for complete search history.

(56) References Cited

U.S. PATENT DOCUMENTS

| 6,275,540 | B1 * | 8/2001 | Barrett et al. ............ 375/316 |
| 6,331,948 | B2 | 12/2001 | Kasai et al. |
| 6,441,767 | B1 | 8/2002 | Frazier |
| 8,077,060 | B2 | 12/2011 | Momtaz et al. |
| 2005/0008093 | A1 | 1/2005 | Matsuura et al. |
| 2007/0280374 | A1 | 12/2007 | Matsuura et al. |
| 2010/0271120 | A1 | 10/2010 | Momtaz et al. |

OTHER PUBLICATIONS

U.S. Appl. No. 12/582,442 Non-Final Office Action mailed Dec. 13, 2010, 5 pages.
U.S. Appl. No. 12/582,442 Final Office Action mailed May 2, 2011, 5 pages.
U.S. Appl. No. 12/582,442 Non-Final Office Action Response mailed Apr. 14, 2011, 12 pages.
Response to Final Office Action filed for U.S. Appl. No. 12/582,442, filed Aug. 2, 2011, 8 pages.
Notice of Allowance received for U.S. Appl. No. 12/582,442, mailed on Aug. 12, 2011, 7 pages.

* cited by examiner

*Primary Examiner* — Jean B Jeanglaude
(74) *Attorney, Agent, or Firm* — McDermott Will & Emery LLP (57) ABSTRACT

According to one general aspect, a distributed threshold adjuster (DTA) may be interspersed between stages of a multistage amplifier to adjust the DC voltage of an input signal. The DTA may include an input signal terminal configured to receive the input signal. The DTA may also include a plurality of current sources configured to produce an adjustment current signal whose amperage is configured to be increased or decreased by fixed steps in order to adjust the DC voltage of the input signal. The DTA may include a control unit configured to selectively turn on or off the individual current sources of the plurality of current sources to select the amperage of the adjustment current signal. The DTA may further include an output terminal configured to produce an output signal, comprising a combination of the input signal and the adjustment current signal, to a stage of a multistage amplifier.

20 Claims, 9 Drawing Sheets

DISTRIBUTED THRESHOLD ADJUSTMENT FOR HIGH SPEED RECEIVERS

CROSS-REFERENCE TO RELATED APPLICATION

This application is a continuation of application Ser. No. 12/582,442, filed on Oct. 20, 2009, now issued as U.S. Pat. No. 8,077,060, which claims the benefit of U.S. Provisional Application No. 61/172,330, filed on Apr. 24, 2009. Both are entitled "DISTRIBUTED THRESHOLD ADJUSTMENT FOR HIGH SPEED RECEIVERS". The subject matter of these earlier filed applications are hereby incorporated by reference.

TECHNICAL FIELD

This description relates to communicating information, and specifically to the adjustment of a threshold in a receiver.

BACKGROUND

Generally, information is transferred between two or more devices via an analog signal. Upon receipt this received analog signal is often converted into a digital signal. Frequently, this conversion is aided by a slicer or comparator that decides upon a digital value (e.g., "0", "1", etc.) based upon a threshold value.

For example, in one instance, distortion in optical fiber or a wireless system may lead to an asymmetric distribution of ones/highs and zeros/lows around a received logical high and low levels. As a result, a received eye-opening, as discussed below, may not be centered and the signal-to-noise ratio at an input sampler or device may be reduced.

SUMMARY

A system and/or method for communicating information, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
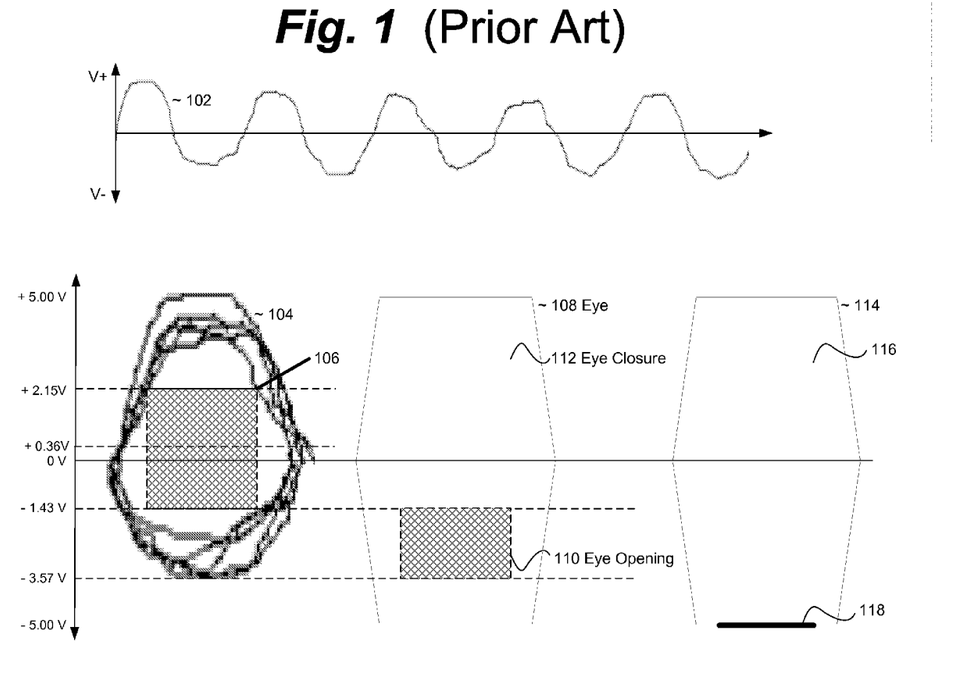
FIG. 1 is a block diagram of an example embodiment of a system relevant to the disclosed subject matter.

FIG. 1 illustrates an embodiment of a technique to determine a digital value of an analog signal based upon a threshold. In one embodiment, an analog signal 102 may be received by a device.

The eye diagram 104 is an embodiment of a time domain representation of a collection of successive traces of the received signal 102 over a period lasting 1-bit of information. The magnitude of the signal is represented by the Y-axis in volts. In this embodiment the amplitude of the signal ranges from a value of "0" (e.g., −5V) to a value of "1" (e.g., +5V); although, it is understood that the above is merely one illustrative example to which the disclosed subject matter is not limited. When the signal has a value that is designated a "1" the signal trace will fall generally within the upper portion of the eye diagram 104. Conversely, when the signal has a value that is designated a "0" the signal trace will fall generally within the lower portion of the eye diagram 104.

An eye opening 106 in the eye diagram 104 represents the open portion of the eye diagram derived from successive overlapping traces of the signal 102 in a 1-bit period as described above. In various embodiments, the eye opening 106 may naturally occur off-center, for example, at +0.36 V versus 0 V.

In some applications the eye opening 106 may be shifted down from the center (along the Y-axis) of the eye diagram 104. For example, in an optical channel signals are represented as "1"s and "0"s by modulating the intensity of a light source from high intensity (e.g., a "1" or +5V) to low intensity (e.g., a "0" or −5V). In practice, however, some level of signal spread or degradation may be present in the signal for received "1"s and "0"s. However, less signal spread or degradation may occur for received "0"s. In other words, the signal spread of the "1"s may be larger than the signal spread of the "0"s). As a result, the middle of the eye from a magnitude standpoint may not be at level 0 V but may, instead, be at a lower level, for example, −0.36V.

To compensate for this shifted eye opening, in various embodiments, it is desirable to either adjust a threshold (e.g., adjust the DC level) of the signal or adjust a threshold level (e.g., adjust a signal provided to a threshold input) of a circuit (e.g., a slicer) that determines whether the signal is currently a "0" or a "1". In the former case, a DC component may be added to the signal to, in effect, raise or lower the eye opening 106 of the signal upwards so that the middle (with respect to the Y-axis) of the eye opening is at a more desirable level. In the latter case, the level of a threshold input signal for the slicer may be similarly adjusted.

The eye diagram 108 illustrates that, in one embodiment, the eye opening 110 may be significantly below the middle of the eye diagram 108, or, in another embodiment, above the middle of the eye diagram. For example, in one embodiment, the eye opening 110 may occur between −1.43V and −3.57V, with the eye closing 112 comprising the rest of the eye diagram 108. It is understood that the eye diagram 108 includes an abstracted version of a series of superimposed collection of successive traces of a received signal 102 over a period lasting 1-bit of information.

The eye diagram 114 illustrates, in some embodiments, that if the received signal (e.g., received signal 102, etc.) is amplified prior to or without regard to an adjustment in the threshold value or DC value of the signal, the eye opening 118 may be moved outside the range of the receiving device. For example, if the received signal comprising the eye diagram 108 is amplified without regard to the "zero point" or center of the eye opening 110, the eye closing 112 (which comprises the received signal) may increase to include the entire eye diagram 114 (shown as eye closing 116). Said another way, as the received signal is amplified, the mid-point of the eye opening 110 (e.g., −2.5V) may be increased or amplified beyond the 5V limitation or rail of the receiving device, and essentially no longer exist.

Figure 2:
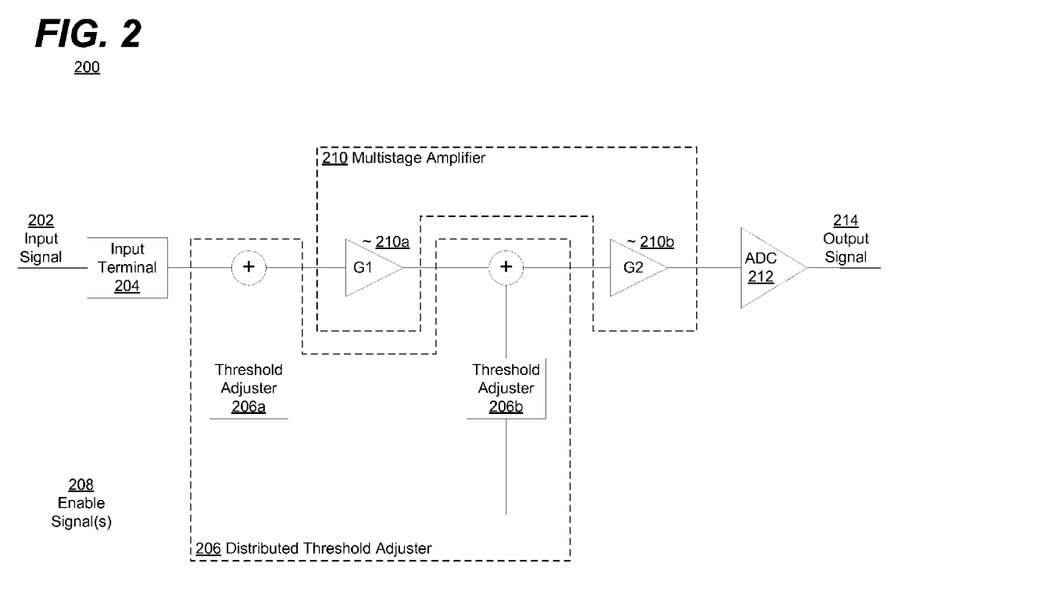
FIG. 2 is a block diagram of an example embodiment of a system in accordance with the disclosed subject matter.

FIG. 2 is a block diagram of an example embodiment of a system 200 in accordance with the disclosed subject matter. In one embodiment, the system 200 may include an input terminal 204, a distributed threshold adjuster 206, a multi-stage amplifier 210 and an analog-to-digital converter (ADC) 212. In one embodiment, the system 200 may receive an input signal 202 and produce an output signal 214. In various embodiments, the system 200 may also receive one or more enable signals 208.

In one embodiment, the system 200 may receive an input signal 202 via input terminal 204. In various embodiments, this input signal 202 may include an analog signal. In some embodiments, the input signal 202 may include a fiber optic signal. In another embodiment, the input signal 202 may include a wireless or wireless-in-origin electrical signal. Although, it is understood that the above are merely a few illustrative examples to which the disclosed subject matter is not limited.

In various embodiments, the input signal 202 may then be amplified (e.g., via multistage amplifier 210) and then threshold or DC adjusted (e.g., via distributed threshold adjuster 206). However, as described above, this may lead to amplifying the eye opening or threshold level beyond the limitations (e.g., electrical rail voltages, etc.) of the receiving device. Herein, unless expressly stated the term "threshold adjustment" includes the addition or subtraction of a DC voltage or current level to the input signal.

In one embodiment, threshold adjustment circuits 206a and 206b may be distributed throughout the gain stages 210a and 210b such that the input signal's DC level is adjusted at multiple locations. As will be seen, this structure and/or technique may be applied in various architectures.

In various embodiments, two threshold adjust circuits 206a and 206b may be included in the data path. In the illustrated embodiment, the first threshold adjustment circuit 206a may be at the input (e.g., after input terminal 204, etc.) while the second threshold adjustment circuit 206b may be after a large gain (e.g., 10 times, etc.) amplifier 210a.

In one embodiment, both threshold adjustment circuits 206a and 206b have, for example, 10 mV resolution and include 6-bits of granularity. In such an embodiment, this configuration may meet both the specified range and resolution criteria for an input signal 202 with a peak-to-peak swing between 10 mV and 1V.

In one embodiment, the system 200 may include a multi-stage amplifier 210. In one embodiment, this multistage amplifier 210 may be configured to provide a gain of 40. In one embodiment, the first amplifier 210a may provide a substantially or relatively large amount of gain G1 (e.g., 10 times, etc.). And a second amplifier 210b may provide a relatively small amount of gain G2 (e.g., 4 times, etc.) In the illustrated embodiment, the total gain of the multistage amplifier 210 may be 40; although, it is understood that the above is merely one illustrative example to which the disclosed subject matter is not limited.

In such an embodiment, any threshold or DC level adjustment preformed by the first threshold adjustment circuit 206a or a similar circuit prior to the amplifier 210a may produce or yield a coarse or large granularity of threshold adjustment, as any threshold adjustment will be multiplied by 10 (in this embodiment) via amplifier 210a. Likewise, a subsequent threshold adjustment circuit (e.g., threshold adjustment circuit 206b) may provide a fine or smaller granularity of threshold adjustment.

For example, if the swing of the input signal 202 is relatively small (e.g., between 10 mV and 100 mV), the first or coarse grain threshold adjustment circuit 206a may be disabled or shut down (e.g., via enable signal(s) 208) and only the second or fine grain threshold adjustment circuit 206b may provide the desired DC adjustment signal. Although, it is understood that the above is merely one illustrative example to which the disclosed subject matter is not limited. Conversely, if the input of the input signal 202 is relatively small (e.g., between 100 mV and 1V), the second or fine grain threshold adjustment circuit 206b may be disabled or shut down and the first or coarse grain threshold adjustment circuit 206a may be enabled and thereby adjust the received signal's 202 DC level. In such an embodiment, a wide input swing range or voltage range of the input signal 202 may be handled, allowing for a larger dynamic range of the input signal 202. In another embodiment, both of the threshold adjustment circuits 206a and 206b may be enabled. It is understood that the above are merely a few illustrative examples to which the disclosed subject matter is not limited.

In one embodiment, the system 200 may include an analog-to-digital converter (ADC) 212 configured to convert the amplified analog input signal 202 to a digital output signal 214. In one embodiment, the ADC 212 may include a slicer or a comparator, for example. In various embodiments, a final threshold adjustment circuit (not shown) after the final amplifier stage (e.g., amplifier 210b) may be configured to adjust a threshold or DC level (e.g., a second comparator input, etc.) used or employed by the ADC 212 to make a decision in converting the analog signal to a digital signal, as opposed to directly altering the DC level of the amplified input signal 202.

In one illustrative embodiment, desired input swing range may be between 100 mV to 1,000 mV. In such an embodiment, each threshold adjustment circuit (e.g., threshold adjuster 206a and 206b, etc.) of the distributed threshold adjuster 206 may include a 6-bit DAC that has the resolution of 10 mV per bit. However, because the second threshold adjuster 206b is after the G1 (e.g., 10×, etc.) gain provided by amplifier 210a, the DC adjustment effectively applied to the input signal 202 is only 1 mV (10 mV/10) per bit. Since the first or coarse threshold adjuster 206a provides a threshold adjust at the input to the multistage amplifier 210 prior to the gain stages, the threshold adjustment effectively applied to the input signal 202 remains 10 mV per bit. As a result, in one embodiment, the DC level or threshold of the input signal 202 may be adjusted over a wide range (e.g., 640 mV=10 mV*2^6 bits) with very fine resolution (e.g., 1 mV steps), produced by the coarse threshold adjuster 206a and the fine threshold adjuster 206b working in concert. It is understood that the above are merely a few illustrative examples to which the disclosed subject matter is not limited.

Figure 3:
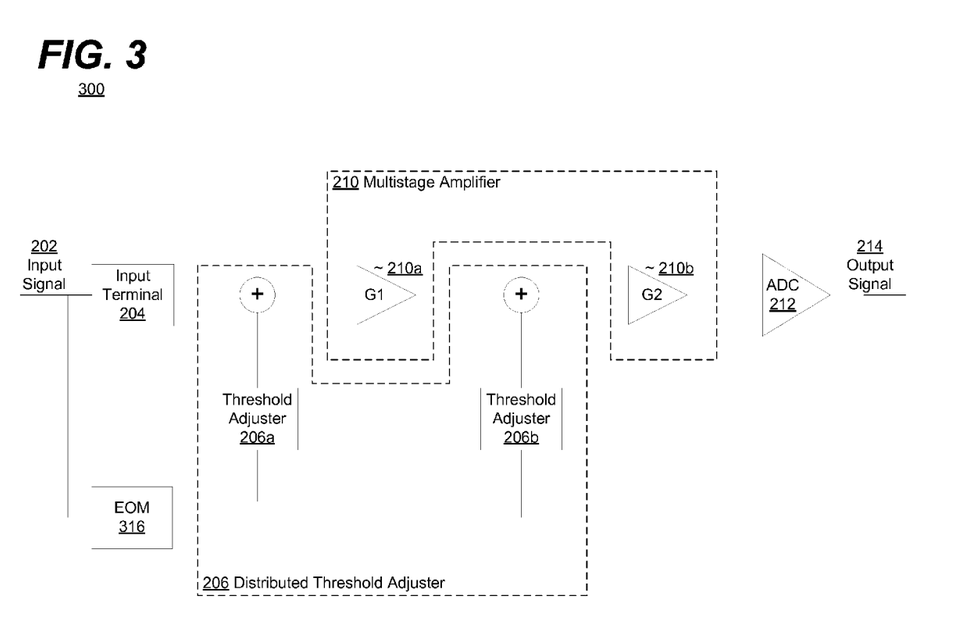
FIG. 3 is a block diagram of an example embodiment of a system in accordance with the disclosed subject matter.

FIG. 3 is a block diagram of an example embodiment of a system 300 in accordance with the disclosed subject matter. In one embodiment, the system 300 may include an input terminal 204, a distributed threshold adjuster 206, a multi-stage amplifier 210 and an analog-to-digital converter (ADC) 212. In one embodiment, the system 300 may receive an input signal 202 and produce an output signal 214.

In one embodiment, the system 300 may include a DC level detection circuit 316. In various embodiments, this DC level detection circuit 316 may include an eye opening monitor (EOM). In one embodiment, the EOM 316 may be configured to measure an average DC voltage level of the analog input signal 202. In another embodiment, the EOM 316 may be configured to control the amount of adjustment provided by the distributed threshold adjuster by, for example, enabling or disabling portions of the distributed threshold adjuster 206; although, it is understood that the above is merely one illustrative example to which the disclosed subject matter is not limited.

Figure 4:
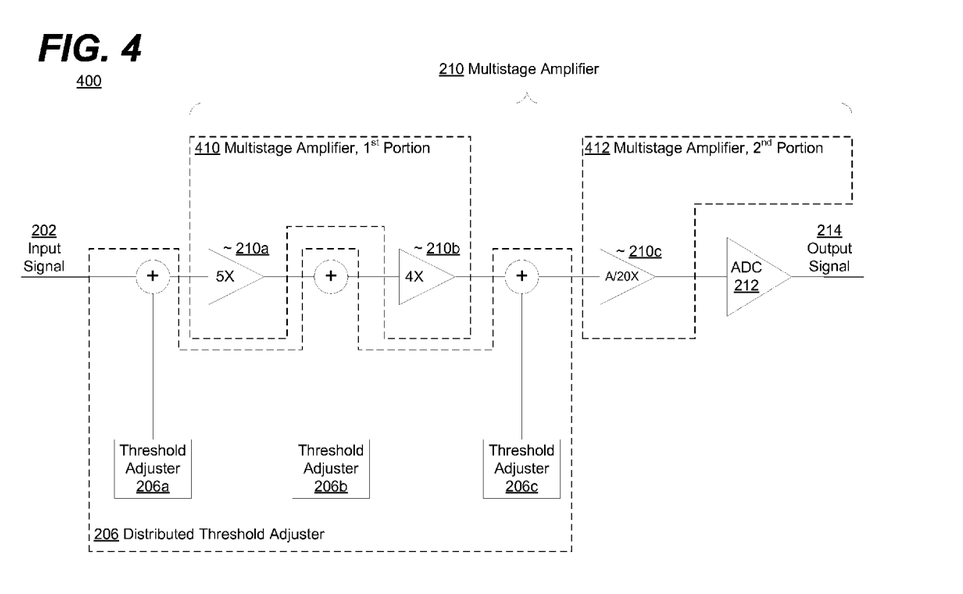
FIG. 4 is a block diagram of an example embodiment of a system in accordance with the disclosed subject matter.

FIG. 4 is a block diagram of an example embodiment of a system 400 in accordance with the disclosed subject matter. In one embodiment, the system 400 may include an input terminal 204, a distributed threshold adjuster 206, a multistage amplifier 210 and an analog-to-digital converter (ADC) 212. In one embodiment, the system 400 may receive an input signal 202 and produce an output signal 214.

In one embodiment, the multistage amplifier 210 may be configured to amplify the analog input signal 202 by an amount of gain, for example, a gain of 'A'; although, it is understood that the above is merely one illustrative example to which the disclosed subject matter is not limited. In the illustrated embodiment, a gain of A is shown, wherein A may be an arbitrary predefined amount of gain. For example, the multistage amplifier chain could have a gain "A" equal to 40. In another embodiment, the amount of gain may be programmable or configurable. In various embodiments, the multistage amplifier 210 may consist of a first portion 410 and a second portion 412.

In one specific illustrative embodiment, the first portion of amplifier stages 410 may include an amplifier 210a with a gain of 5 and an amplifier 210b with a gain of 4, for a total amplification of 20. In such an embodiment, the second portion of amplifier stage(s) 412 may include an amplifier 210c which has a gain equal to one-twentieth of the total gain A of the multistage amplifier chain.

Likewise, in one embodiment, the distributed threshold adjuster 206 may include three threshold adjusters 206a, 206b, and 206c. Although, a 1:1 ratio of amplifier to threshold adjuster has been illustrated, it is understood that the above are merely a few illustrative examples to which the disclosed subject matter is not limited and that any ratio of amplifiers to threshold adjusters may be used or employed.

In one illustrative embodiment, each of the threshold adjusters 206a, 206b, and 206c may include 5-bit DACs. In such an embodiment, the threshold adjustment of each of the threshold adjusters 206a, 206b, and 206c may be increased to 20 mV per bit. However, it is noted that, in various embodiments, a 5-bit DAC may require or utilize approximately half the space of a 6-bit DAC, such that three 5-bit DACs may use less space (e.g., 25% less) than the previously illustrated two 6-but DACS. In various embodiments, space savings may be further increased by further distributing threshold adjusters and reducing the number of bits per threshold adjuster. In such an embodiment, the threshold adjusters 206a, 206b, and 206c may be placed after the input, after the 5× amplifier 210a, and 4× amplifier 210b.

In various embodiments, one or more of the threshold adjusters 206a, 206b, and 206c may be enabled. For example, in one embodiment, for versions of the input signal 202 having a swing or range of between 200 mV and 1V, only the input threshold adjuster 206a may be enabled or turned on. In such an embodiment, both a predefined range criteria (e.g., greater than 60% of the input range, etc.), where 20 mV* $(2^5)$=640 mV>60%*1000 mV, and a resolution criteria (e.g., no more than 10% of the lower end of the input signal 202 range, etc.), where the 20 mV per bit=10% of 200 mV, may be met.

In another embodiment, for versions of the input signal 202 having a swing or range of between 40 mV and 200 mV, only the second threshold adjuster 206b may be enabled or turned on. After the 5× gain provided by the first amplifier 210a, the input signal swing or range may be amplified to a range of between 200 mV and 1V and the situation becomes similar to the one previously described.

In yet another embodiment, for versions of the input signal 202 having a swing or range of between 10 mV and 50 mV, only the third threshold adjuster 206c may be enabled or turned on. After the 20× gain provided by the first portion 410 of the multistage amplifier, the input signal swing or range may be amplified to a range of between 200 mV and 1V and the situation becomes similar to the one previously described.

It is understood that the above are merely a few illustrative examples to which the disclosed subject matter is not limited. In various embodiments, more than one of the threshold adjusters 206a, 206b, and 206c may be enabled or turned on, and provide various levels of coarse or fine grain threshold adjustment. In another embodiment, not every stage of the multistage amplifier 210 may have a threshold adjuster preceding it.

As described above, an apparatus 400 or another embodiment of the disclosed subject matter may provide relatively constant threshold adjustment steps which, when referred back to the input, can be called coarse or fine. In some embodiments, the effective size of the threshold adjustment step applied to any intermediate stage of the amplifier chain, may be determined by dividing the step size at the intermediate stage by the gain from the input of the amplifier to that particular point in the amplifier chain. Therefore, in various embodiments, threshold adjustment steps applied earlier in the amplifier chain may be coarse while those applied later in the amplifier chain may be fine.

In some embodiments, to achieve a step size that is independent of variations arising from temperature, manufacturing etc. one may achieve an amplifier gain that is constant. To extend this further, individual gain stages may achieve a relatively constant gain, in such an embodiment. To achieve the same, the circuitry used to determine the threshold adjustment applied at any intermediate stage may also be designed to exhibit small variations. When divided by the (relatively constant) gain, the threshold adjustment step size referred to the input may be relatively constant within practical limitations, in one embodiment.

As described below, in various embodiments, an individual gain stage (independent of the threshold adjustment circuit) includes load-resistors which are linked to the stage gain as well as the step size and can exhibit fabrication-induced variations. By calibrating the resistor using a known well-controlled resistor, these variations may be reduced. An individual gain stage (independent of the threshold adjustment circuit) may include a certain amount of current flowing through it. By linking this current to a proportional to absolute temperature (PTAT), gain variations arising from temperature variations may be reduced.

In some embodiments, an individual stage's gain can also vary if the operating point conditions are changed. By applying a threshold adjustment current such that the output common-mode is relatively unchanged, the impact of changes in the applied threshold adjustment may be minimized or reduced.

In such an embodiment, the threshold adjustment applied at any intermediate stage in the amplifier chain may be linked to a bandgap referenced biasing circuit so as to minimize variations arising from temperature, manufacturing process or supply voltage changes. If the load resistor through which this current flows is uncalibrated, the threshold adjustment biasing may be provided by a bandgap circuit linked to an uncalibrated resistor. If the load resistor through which the current flows is calibrated, the threshold adjustment biasing may be provided by a bandgap circuit linked to a calibrated resistor.

Figure 5:
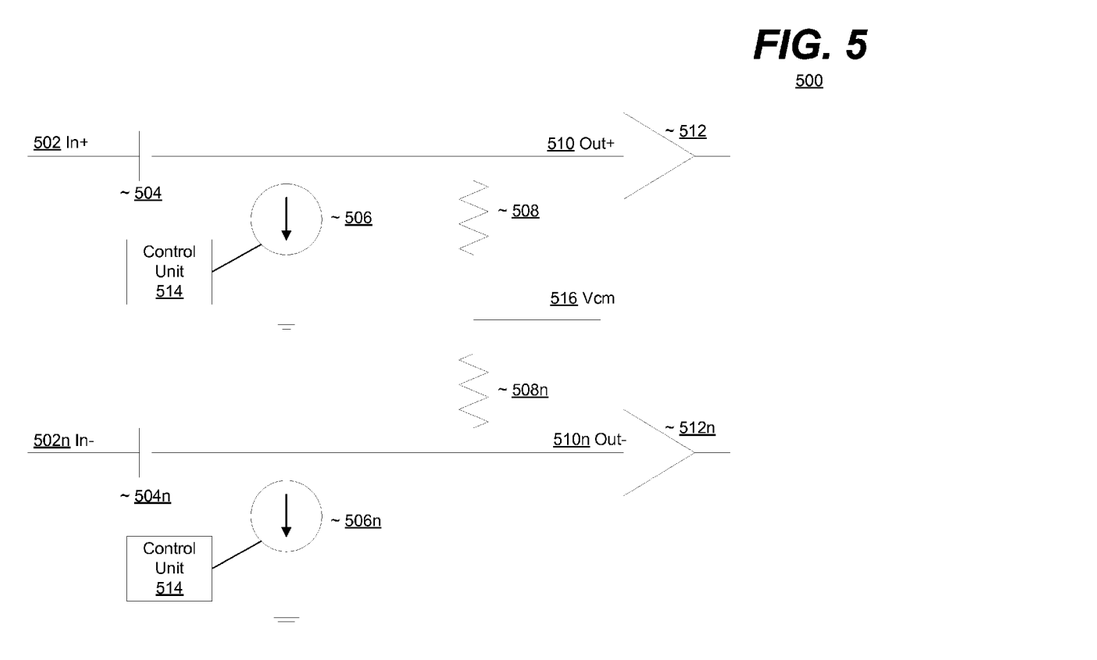
FIG. 5 is a block diagram of an example embodiment of a system in accordance with the disclosed subject matter.

FIG. 5 is a block diagram of an example embodiment of a system 500 in accordance with the disclosed subject matter. In one embodiment, the system 500 provides a more specific illustration of one embodiment of the input termination/threshold adjuster pair found in the above figures (e.g., FIG. 2, 3, 4, etc.). For example, in reference to FIG. 2, the input terminal 204 may include elements 502, 504, 502n and 504n; the threshold adjuster 206a may include elements 506 and 506n; and the amplifiers 210 may include the amplifiers 512 and 512n; although, it is understood that the above is merely one illustrative example to which the disclosed subject matter is not limited. It is understood that the circuit of FIG. 5 is merely one illustrative example to which the disclosed subject matter is not limited.

In one embodiment, the system or circuit 500 may be configured to adjust the DC level or threshold of a differential input signal (e.g., a differential version of input signal 202 of FIG. 2) and amplify the input signal. In one embodiment, the system or circuit 500 may include an input terminal for input signal 502 and 502n, a control unit 514, a current source 506 and 506n, an output terminal for output signal 510 and 510n, and an amplifier 512 and 512n.

In one embodiment, the system 500 or input terminal thereof may include a coupling capacitor 504 and/or 504n configured to pass the AC portion of the input signal 502 to the output terminal of system 500.

Furthermore, the system or circuit 500 may include a pair of resistors 508 and 508n separating the two differential input signal or positive and negative portions of the input signal. In one embodiment, the pair of resistors or resistive elements 508 may be coupled in series with respect to one another and in parallel with respect to the output terminal. In such an embodiment, the resistors or resistive elements 508 and 508n may be configured to produce a common mode voltage (Vcm) 516 provided at the common terminal of the resistor elements 508 and 508n.

In one embodiment, the input terminal may be configured to receive the input signal 502 (e.g., input signal 202 of FIG. 2). In various embodiments, the current source 506 may be configured to produce an adjustment current signal whose amperage is configured to be increased or decreased in order to adjust the DC voltage of the input signal. In some embodiments, the control unit 514 may be configured to selectively control the current sources to select the amperage of the adjustment current signal.

As described below, in various embodiments, the current source 506 may include a plurality of current sources. In such an embodiment, each of the plurality of current sources may be configured to provide a current that may be selectively added or subtracted from the input signal. Also, in such an embodiment, control unit 514 may be configured to selectively turn on or off the individual current sources of the plurality of current sources to select the amperage of the adjustment current signal.

In various embodiments, the system or circuit 500 may include an output terminal 510. In some embodiments, the output terminal may be configured to produce an output signal 510 to a stage of a multistage amplifier 512. In such an embodiment, the output signal may include a combination of the input signal and the adjustment current signal, as described above.

Figure 6:
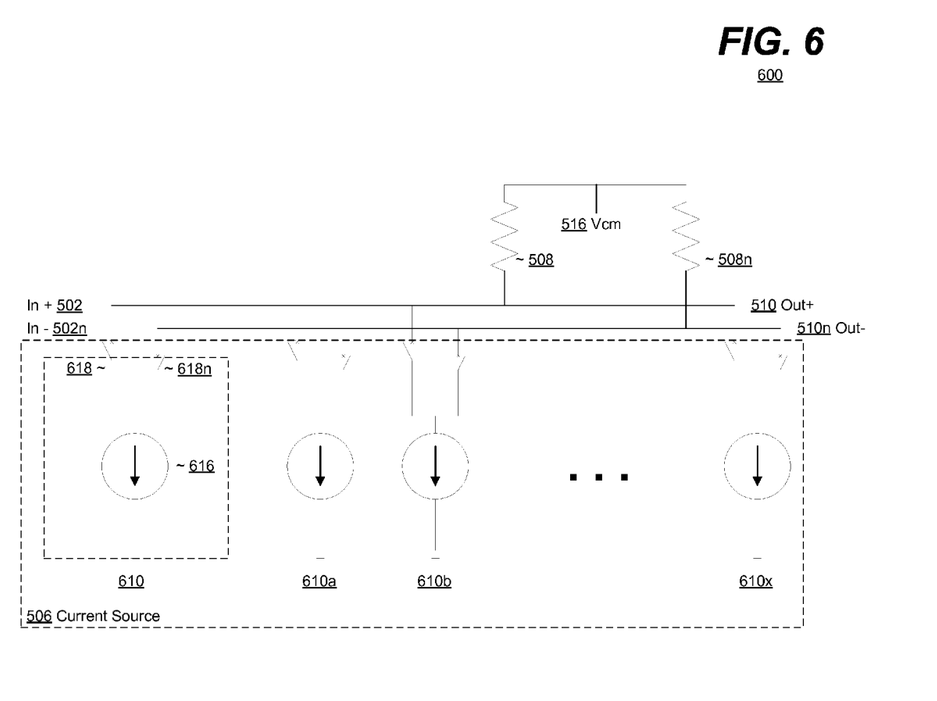
FIG. 6 is a block diagram of an example embodiment of a system in accordance with the disclosed subject matter.

FIG. 6 is a block diagram of an example embodiment of a system 600 in accordance with the disclosed subject matter. FIG. 6 provides additional detail regarding a threshold adjuster of a distributed threshold adjuster system; although, it is understood that the above is merely one illustrative example to which the disclosed subject matter is not limited.

In one embodiment, the system or circuit 600 may include a current source 506. In various embodiments, the current source 506 may include a plurality of current sources 610 (e.g., current sources 610a, 610b, 610x, etc.). In such an embodiment, each of the plurality of current sources 610 may be configured to provide a current that may be selectively added or subtracted from the input signals 502 and 502n.

In some embodiments, each current source or current cell 610 may be configured to produce a positive and a negative adjustment current. In various embodiments, the plurality of current sources 610 may be coupled such that the positive current signal is combined with a positive differential input signal 502 and the negative current signal is combined with a negative differential input signal 502n. In some embodiments, the absolute values of the amperage of the positive and negative current signals may be substantially equal.

In various embodiments, each current source or current cell 610 may include a current source 616 and a pair of switches 618 and 618n. In various embodiments, these switches 618 may be controlled by a control unit. In various embodiments, the control unit may include a DAC, as described above. In such an embodiment, each bit of the DAC may be configured to control one of the plurality of current sources 610. In such an embodiment, as the number of bits of the DAC are "turned on" or enabled, the amount of current provided by the current source 506 may be increased, or conversely decreased as the bits are "turned off" or disabled. Although, it is understood that the above is merely one illustrative example to which the disclosed subject matter is not limited.

In one embodiment, the plurality of current sources 610 may be coupled between the input terminal of the input signal 502 and 502n and the pair of resistors 508 and 508n. In some embodiments, the plurality of current sources 610 may be coupled such that the output 510 and 510n common mode voltage remains substantially constant regardless of the amperage of the adjustment current source 506. By minimizing changes in the operating points of the devices comprising the amplifier chain, this enables a reduction in the gain variations per stage of the amplifier chain.

Figure 7:
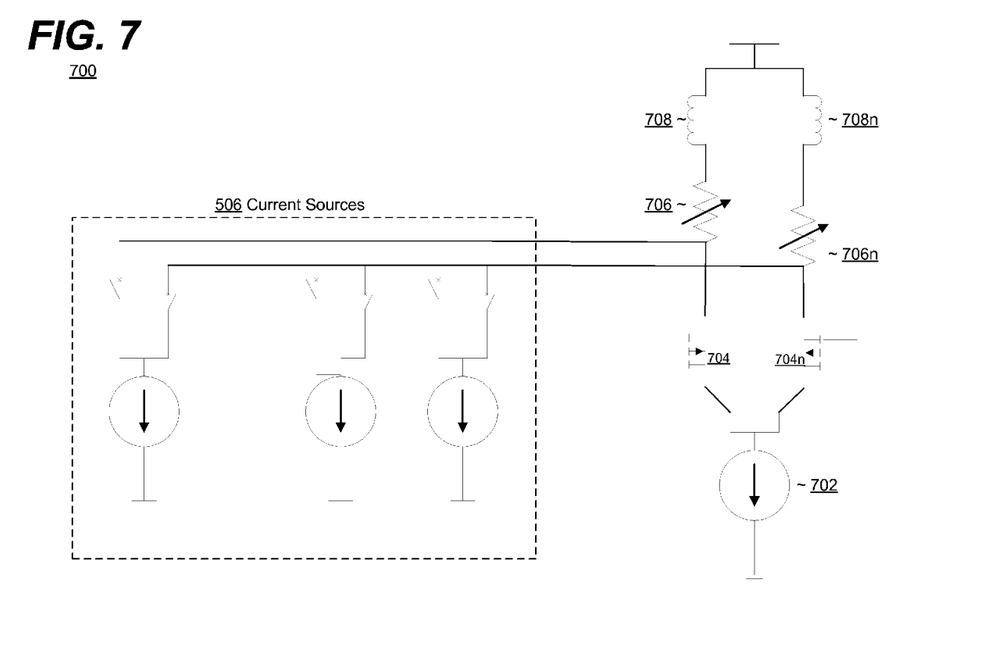
FIG. 7 is a block diagram of an example embodiment of a system in accordance with the disclosed subject matter.

FIG. 7 is a block diagram of an example embodiment of a system 700 in accordance with the disclosed subject matter. In one embodiment, the system 700 may correspond to, for example, the amplifier 210a and the threshold adjuster 206b of FIG. 2; although, it is understood that the above is merely one illustrative example to which the disclosed subject matter is not limited. In one embodiment, the plurality of current sources 506 may be configured to provide a substantially constant step size regardless of temperature, wherein the temperature variation is within a predetermined range of operating temperatures (e.g., 0-125 C, etc.).

In various embodiments, such a system or circuit 700 may be used or employed for intermediate portions of the distributed threshold adjuster. In various embodiments, a resistive element (e.g., resistive elements 706 and 706n) may be used or employed in the amplification stages that may exhibit variations arising naturally from manufacturing processes.

In one embodiment, the plurality of current sources 702 of FIG. 7 used to bias the gain portion of the individual amplifier stages may be coupled with a proportional to absolute temperature (PTAT) biasing circuit to reduce the temperature-induced variations in the gain per stage of the multistage amplifier chain. In various embodiments, the configurable resistive elements 706 and 706n may be calibrated using a well-controlled external resistor to reduce the fabrication-induced variations arising naturally from semiconductor manufacturing processes. This further reduces variations in the gain per stage of the multistage amplifier chain and advances the goal of an amplifier gain that is constant within practical limitations. This may differ from some embodiments, in which the input terminal uses or employs un-calibrated resistive elements, as illustrated by FIG. 6.

In various embodiments, each of the plurality of current sources 506 of FIG. 7 used to bias the threshold adjustment portion (as distinct from the gain portion described above) applied at a particular amplifier stage may include a bandgap-based reference current source, particularly when the resistive elements 706 and 706n have been calibrated to reduce fabrication-induced variations as described above. In various embodiments, the bandgap-based reference current source may be generated via a bandgap voltage applied to a calibrated resistor biasing element. In such an embodiment, each of the plurality of current sources 506 may be configured to produce a substantially fixed threshold step size regardless of process, supply voltage level and temperature (PVT) variations.

Furthermore, in various embodiments, by switching current either through the positive or negative terminals of the current sources 506 the total current may be kept substantially constant. In such an embodiment, a substantially fixed common-mode voltage may be maintained. In some embodiments, this may help to maintain substantially constant gain throughout the multi-stage amplifier.

Figure 8:
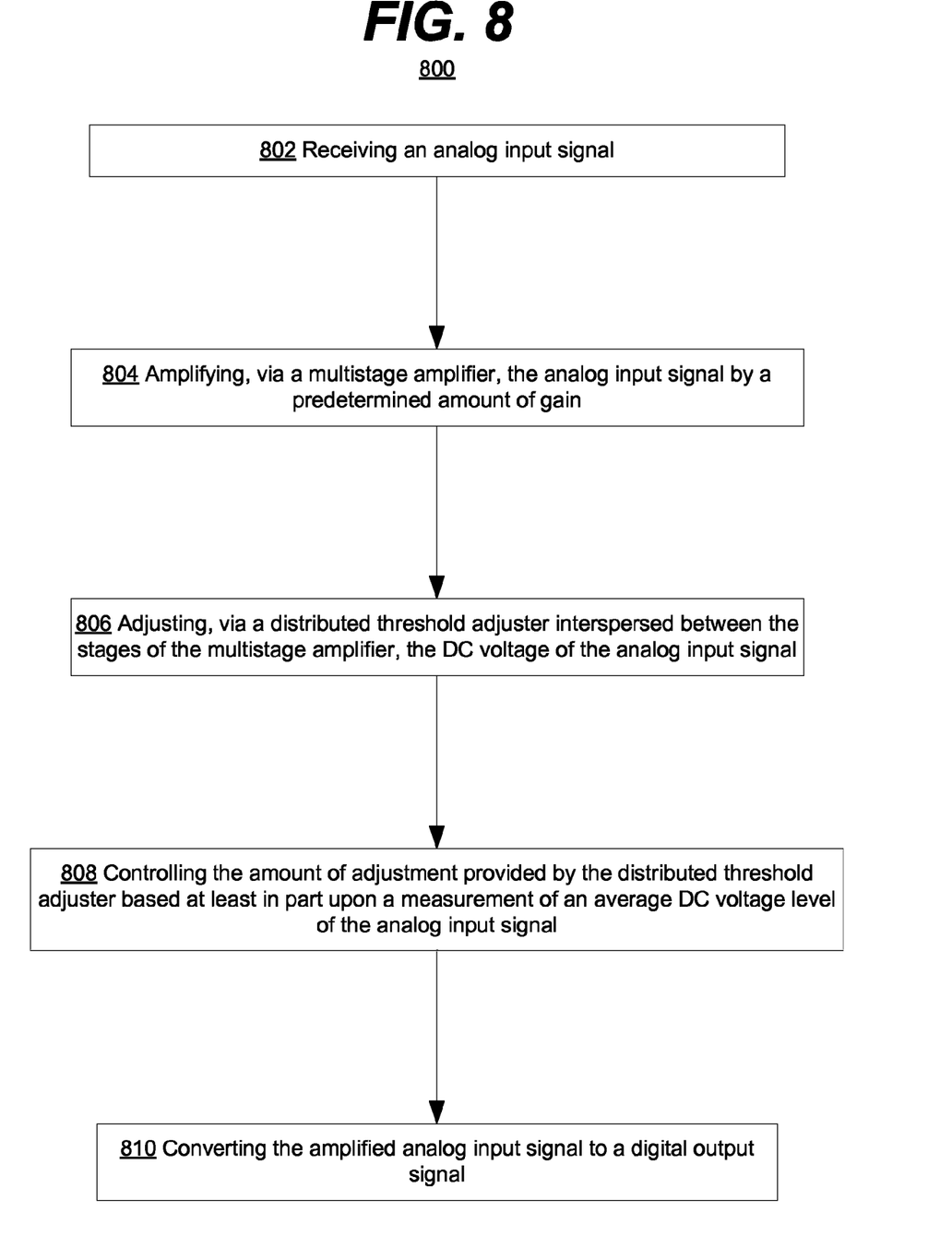
FIG. 8 is a flow chart of an example embodiment of a technique in accordance with the disclosed subject matter.

FIG. 8 is a flow chart of an example embodiment of a technique in accordance with the disclosed subject matter. In various embodiments, the technique 800 may be used or produced by the systems such as those of FIG. 2, 3, 4, 5, 6, or 7. Furthermore, portions of technique 800 may be used or produced by the systems such as that of FIG. 2, 3, or 4, while another portion of technique 800 may be used or produced by the systems such as that of FIG. 5, 6, or 7. Although, it is understood that the above are merely a few illustrative examples to which the disclosed subject matter is not limited. Furthermore, it is understood that the disclosed subject matter is not limited to the ordering of or number of actions illustrated by technique 800.

Block 802 illustrates that, in one embodiment, an analog input signal may be received, as described above. In various embodiments, the analog input signal may include a pair of differential signals, as described above. In some embodiments, the analog signal may include an optical signal. In yet another embodiment, the analog signal may include signal derived from a wireless electrical signal. In various embodiments, one or more of the action(s) illustrated by this Block may be performed by the apparatuses or systems of FIG. 2, 3, 4, 5, 6, or 7, at the input terminal of FIG. 2, 3, or 4, as described above.

Block 804 illustrates that, in one embodiment, the analog input signal may be amplified by a predetermined amount of gain, as described above. In one embodiment, this amplification may occur via a multistage amplifier, as described above. In one embodiment, the first portion of amplifier stages may include non-uniform gain steps, as described above. In various embodiments, one or more of the action(s) illustrated by this Block may be performed by the apparatuses or systems of FIG. 2, 3, 4, 5, 6, or 7, through the multistage amplifier 210 of FIG. 2, 3, or 4, as described above.

Block 806 illustrates that, in one embodiment, the DC voltage of the analog input signal may be adjusted, as described above. In one embodiment, this adjustment may occur via a distributed threshold adjuster interspersed between the stages of the multistage amplifier, as described above. In various embodiments, the distributed threshold adjuster may be interspersed between the first portion of amplifier stages, as described above. In one embodiment, the distributed threshold adjuster may include a plurality of threshold adjusters configured to each provide a different granularity of DC voltage adjustment to the analog input signal, as described above. In such an embodiment, each of the plurality of threshold adjusters may be configured to be selectively turned either on (enabled) or off (disabled), as described above.

In some embodiments, each subsequent threshold adjuster may be configured to provide less of a DC voltage adjustment, in terms of the predetermined amount of gain, than the respective previous threshold adjuster, as described above. In such an embodiment, while each threshold adjuster may provide a substantially equal gain (e.g., 10 mV) in isolation, due to the placement of the individual threshold adjusters amongst the amplifier stages (e.g., providing gains of 1×, 10×, etc.), each of the threshold adjusters may contribute a different level of adjustment (e.g., 10 mV, 1 mV, etc.) effectively to the input signal, as described above.

In some embodiments, adjusting may include providing a DC voltage adjustment of up to +/−60% of a maximum voltage of the analog input signal with an adjustment resolution of less than or equal to 1% of the maximum voltage of the analog input signal, as described above. In various embodiments, one or more of the action(s) illustrated by this Block may be performed by the apparatuses or systems of FIGS. 2, 3, 4, 5, 6, or 7, through the distributed threshold adjuster 206 of FIG. 2, 3, or 4, as described above.

Block 808 illustrates that, in one embodiment, the amount of adjustment provided by the distributed threshold adjuster may be controlled based at least in part upon a measurement of an average DC voltage level of the analog input signal eye opening, as described above. In various embodiments, this control may be provided by including an eye opening monitor (EOM) configured to measure an average DC voltage level of the analog input signal eye opening, as described above. In various embodiments, one or more of the action(s) illustrated by this Block may be performed by the apparatuses or systems of FIG. 2, 3, 4, 5, 6, or 7, the enable signal(s) 208 of FIG. 2, or the EOM 316 of FIG. 3, as described above.

Block 810 illustrates that, in one embodiment, the amplified analog input signal may be converted to a digital output signal, as described above. In one embodiment, this conversion may include the use or employment of a slicer or comparator, as described above. In various embodiments, the output signal may include a pair of differential output signals, as described above. In various embodiments, one or more of the action(s) illustrated by this Block may be performed by the apparatuses or systems of FIG. 2, 3, 4, 5, 6, or 7, through the ADC 212 of FIG. 2, 3, or 4 as described above.

Figure 9:
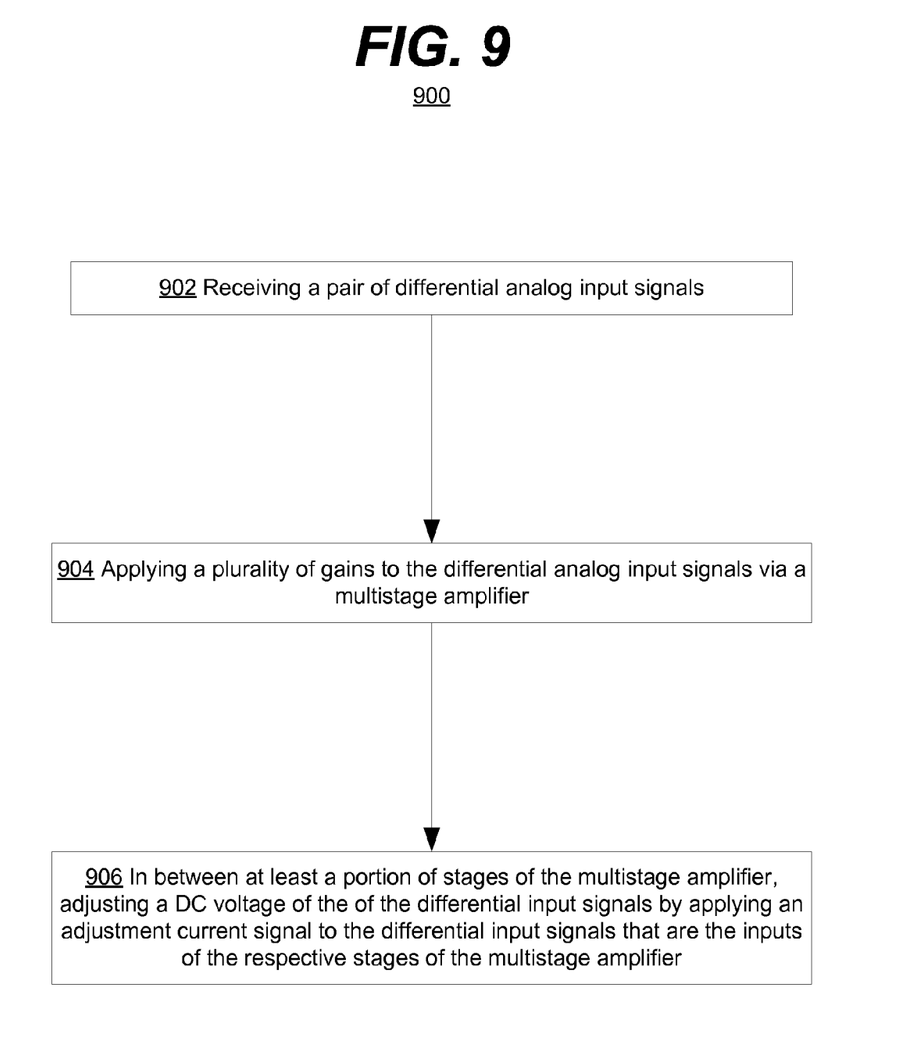
FIG. 9 is a flow chart of an example embodiment of a technique in accordance with the disclosed subject matter.

FIG. 9 is a flow chart of an example embodiment of a technique in accordance with the disclosed subject matter. In various embodiments, the technique 900 may be used or produced by the systems such as those of FIG. 2, 3, 4, 5, 6, or 7. Furthermore, portions of technique 900 may be used or produced by the systems such as that of FIG. 2, 3, or 4, while another portion of technique 900 may be used or produced by the systems such as that of FIG. 5, 6, or 7. Although, it is understood that the above are merely a few illustrative examples to which the disclosed subject matter is not limited. Furthermore, it is understood that the disclosed subject matter is not limited to the ordering of or number of actions illustrated by technique 900.

Block 902 illustrates that, in one embodiment, a pair of differential analog input signals may be received, as described above. In some embodiments, the analog signals may include optical signals. In yet another embodiment, the analog signals may include signals derived from wireless electrical signals. In various embodiments, one or more of the action(s) illustrated by this Block may be performed by the apparatuses or systems of FIG. 2, 3, 4, 5, 6, or 7, by means of the input terminal of FIG. 5, 6, or 7, as described above.

Block 904 illustrates that, in one embodiment, a plurality of gains may be applied to the differential analog input signals via a multistage amplifier, as described above. In various embodiments, one or more of the action(s) illustrated by this Block may be performed by the apparatuses or systems of FIG. 2, 3, 4, 5, 6, or 7, the multistage amplifier 210 of FIG. 2, 3, or 4, as described above.

Block 906 illustrates that, in one embodiment, a DC voltage of the differential input signals may be adjusted by applying an adjustment current signal to the differential input signals that are the inputs of the respective stages of the multistage amplifier, as described above. In various embodiments, this adjustment may occur between at least a portion of stages of the multistage amplifier, as described above.

In various embodiments, adjusting DC voltage of the differential input signals may include producing, from a plurality of current sources, an adjustment current whose amperage is dynamically increased or decreased by fixed steps, as described above. In one embodiment, adjusting DC voltage of the differential input signals may also include selectively turning on or off the plurality of current sources to dynamically select the amperage of the adjustment current signal, as described above. In some embodiments, adjusting DC voltage of the differential input signals may also include adding the adjustment current signal to the differential input signals, as described above.

In some embodiments, selectively turning on or off the plurality of current sources to dynamically select the amperage of the adjustment current signal may include employing a multi-bit digital-to-analog converter to control whether or not each of the plurality of current sources is turned on or off, as described above. In such an embodiment, each current source may be controlled by a respective bit of the digital-to-analog converter, as described above.

In various embodiments, the adjustment current signal may be applied such that a common mode voltage between the differential analog input signals remains substantially constant regardless of the amperage of the adjustment current signal, as described above. In various embodiments, one or more of the action(s) illustrated by this Block may be performed by the apparatuses or systems of FIG. 2, 3, 4, 5, 6, or 7, the distributed threshold adjuster 206 of FIG. 2, 3, or 4, or the current sources 506 of FIG. 5, 6, or 7 as described above.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A distributed threshold adjuster (DTA) interspersed between a plurality of stages of a multistage amplifier and configured to adjust the DC voltage of an input signal to facilitate a decision by an analog-to-digital converter (ADC) comprising:

an input signal terminal configured to receive the input signal;

a plurality of current sources configured to produce an adjustment current signal whose amperage is configured to be increased or decreased by fixed steps in order to adjust the DC voltage of the input signal, wherein each of the plurality of current sources are configured to provide a current that may be selectively added or subtracted from the input signal;

a control unit configured to selectively turn on or off the individual current sources of the plurality of current sources to select the amperage of the adjustment current signal; and an output terminal configured to produce an output signal, comprising a combination of the input signal and the adjustment current signal, to a stage of a multistage amplifier.

2. The DTA of claim 1, wherein the output terminal is coupled with the input terminal and the current sources.

3. The DTA of claim 1, wherein the input signal terminal includes a coupling capacitor configured to pass the AC portion of the input signal to the output terminal.

4. The DTA of claim 1, wherein the input signal includes a pair of differential input signals, and the output signal includes a pair of differential output signals; and the DTA further includes a pair of resistors coupled in series with respect to one another and in parallel with respect to the output terminal, and configured such that a common mode voltage (Vcm) exists between the pair of resistors.

5. The DTA of claim 4, wherein the plurality of current sources are coupled between the input terminal and the pair of resistors; and the plurality of current sources are coupled such that the output common mode voltage remains substantially constant regardless of the amperage of the adjustment current source.

6. The DTA of claim 4, wherein the plurality of current sources are configured to produce a positive adjustment current signal and a negative adjustment current signal;

wherein the input signal includes a differential analog input signal; and wherein the positive adjustment signal and the negative adjustment signal are interchangeably applied to the differential analog input signal.

7. The DTA of claim 1, wherein the plurality of current sources are configured to provide a substantially constant step size regardless of temperature.

8. The DTA of claim 7, wherein the plurality of current sources may be configured to produce a substantially fixed threshold step size regardless of process, supply voltage level and temperature variations.

9. A system comprising:

a receiver configured to receive a pair of differential analog input signals;

a multistage amplifier configured to amplify the analog input signals by an amount of gain;

a plurality of distributed threshold adjusters (DTAs) interspersed between the stages of the multistage amplifier, and configured to adjust the DC voltages of the differential analog input signals to facilitate a decision by an analog-to-digital converter (ADC), and wherein each of the distributed threshold adjusters includes:

a plurality of current sources configured to produce an adjustment current signal whose amperage is configured to be increased or decreased by fixed steps in order to adjust the DC voltage of the input signal, and a control unit configured to selectively turn on or off the individual current sources of the plurality of current sources to select the amperage of the adjustment current signal; and the ADC configured to convert the amplified analog input signals to a digital output signal.

10. The system of claim 9, wherein each of the DTAs further includes a pair of resistors coupled in series with respect to one another and in parallel with respect to the output terminals of the DTA, and configured such that a common mode voltage (Vcm) exists between the pair of resistors.

11. The system of claim 10, wherein the plurality of current sources are coupled between the input terminals of the respective DTA and the pair of resistors; and the plurality of current sources are coupled such that the common mode voltage remains substantially constant regardless of the amperage of the adjustment current source.

12. The system of claim 9, wherein the plurality of current sources are configured to produce a positive adjustment current signal and a negative adjustment current signal;

wherein the input signal includes a differential analog input signal; and wherein the positive adjustment signal and the negative adjustment signal are interchangeably applied to the differential analog input signal.

13. The system of claim 12, wherein the absolute values of the amperage of the positive and negative adjustment current signals are substantially equal to maintain a relatively constant output common-mode voltage per amplifier stage and minimizing an operating-point induced gain variation per amplifier stage.

14. The system of claim 9, wherein the plurality of current sources are configured to provide a substantially constant step size regardless of temperature.

15. The system of claim 14, wherein the plurality of gain stages comprising the multistage amplifier chain are coupled with a proportional to absolute temperature (PTAT) biasing circuit to reduce temperature-induced variations in the gain per amplifier stage.

16. The system of claim 14, wherein the plurality of current sources employed to provide the threshold adjustment are coupled with either a calibrated or an uncalibrated bandgap biased resistor, depending on whether the corresponding load resistor through which the applied current flows is calibrated or uncalibrated, to provide a substantially constant step size regardless of temperature, supply-voltage changes or fabrication-induced variations.

17. The system of claim 14, wherein each of the plurality of current sources employed to provide the threshold adjustment includes a bandgap-based reference current source.

18. A method comprising:

receiving a pair of differential analog input signals;

applying a plurality of gains to the differential analog input signals via a multistage amplifier; and in between at least a portion of stages of the multistage amplifier, adjusting a DC voltage of the differential input signals by applying an adjustment current signal to the differential input signals that are the inputs of the respective stages of the multistage amplifier.

19. The method of claim 18, wherein applying an adjustment current signal comprises:

producing, from a plurality of current sources, an adjustment current signal whose amperage is dynamically increased or decreased by fixed steps, selectively turning on or off the plurality of current sources to dynamically select the amperage of the adjustment current signal, and adding the adjustment current signal to the differential input signals.

20. The method of claim 19, wherein selectively turning on or off the plurality of current sources to dynamically select the amperage of the adjustment current signal includes:

employing a multi-bit digital-to-analog converter to control whether or not each of the plurality of current sources is turned on or off; and  wherein each current source is controlled by a respective bit of the digital-to-analog converter.

\* \* \* \* \*